(12) United States Patent
Kindt et al.

(10) Patent No.: US 7,671,677 B2
(45) Date of Patent: Mar. 2, 2010

(54) CURRENT SENSE AMPLIFIER WITH EXTENDED COMMON MODE VOLTAGE RANGE

(75) Inventors: Willem Johannes Kindt, Berkel en Rodenrijs (NL); Michiel Antonius Petrus Pertijs, Delft (NL)

(73) Assignee: National Semiconductor Corporation, Santa Clara, CA (US)

( * ) Notice: Subject to any disclaimer, the term of this patent is extended or adjusted under 35 U.S.C. 154(b) by 52 days.

(21) Appl. No.: 12/069,967

(22) Filed: Feb. 13, 2008

(65) Prior Publication Data

US 2009/0201086 A1 Aug. 13, 2009

(51) Int. Cl.
*H03F 3/45* (2006.01)
(52) U.S. Cl. .................................... 330/258
(58) Field of Classification Search ................ 330/252, 330/258, 259, 260
See application file for complete search history.

(56) References Cited

U.S. PATENT DOCUMENTS

| | | | |
|---|---|---|---|
| 4,977,378 A * | 12/1990 | Tero | ............................ 330/258 |
| 5,498,984 A | 3/1996 | Schaffer | |
| 5,585,746 A | 12/1996 | Franke | |
| 5,627,494 A | 5/1997 | Somerville | |
| 5,969,574 A | 10/1999 | Legates | |
| 6,380,387 B1 | 4/2002 | Sidduri et al. | |
| 6,621,259 B2 | 9/2003 | Jones et al. | |
| 6,819,170 B1 | 11/2004 | Kindt | |

OTHER PUBLICATIONS

"High Common Mode, Gain of 20, Precision Voltage Difference Amplifier," National Semiconductor Corporation, Jan. 2007, 14 pages.

J. F. Witte, et al., "A Current-Feedback Instrumentation Amplifier with 5μV Offset for Bidirectional High-Side Current-Sensing," ISSCC 2008/Session 3/Filters and Amplifiers/3.5, 2008 IEEE International Solid-State Circuits Conference, pp. 15-17.

V.A. Vashchenko, et al., "Implementation of 60V Tolerant Dual Direction ESD Protection in 5V BiCMOS Process for Automotive Application," Proc. EOS/ESD Symposium, 2004, 8 pages.

V.A. Vashchenko, et al., "High Voltage Tolerant On-Chip ESD Protection in Low-Voltage BiCMOS Process," Journal of Electrostatics, vol. 64, Issue 2, 2006, 31 pages.

Gert van der Horn, et al., "Extension of the Common-Mode Range of Bipolar Input Stages Beyond the Supply Rails of Operational Amplifiers and Comparators," IEEE Journal of Solid-State Circuits, vol. 28, No. 7, Jul. 1993, pp. 750-757.

V.A. Vaschenko, et al., "ESD protection of the high voltage tolerant pins in low-voltage BiCMOS processes," IEEE BCTM 14.5, pp. 277-280, 2004.

"High-pressure solenoid valve," Robert Bosch GmbH, Diesel Engine Management, 2005, 2 pages.

"Huising, Operational Amplifiers, Theory & Design," 2001, 12 pages.

* cited by examiner

*Primary Examiner*—Steven J Mottola

(57) ABSTRACT

A circuit includes an input stage configured to receive and amplify an input signal to produce an amplified signal, where the input signal is referenced to a higher voltage and is associated with a common mode voltage. The circuit also includes level shifter resistors configured to level shift the amplified signal to produce a shifted signal. The level shifter resistors are configured to provide a voltage drop so that the shifted signal is referenced to a lower voltage. The input stage may include multiple transistors floating in one or more isolated portions of a substrate, where the transistors perform amplification in the input stage. The circuit may also include circuitry configured to control current through the level shifter resistors so that the voltage drop depends on the common mode voltage of the input signal. In addition, the lower voltage may be between supply rails of the circuit.

23 Claims, 9 Drawing Sheets

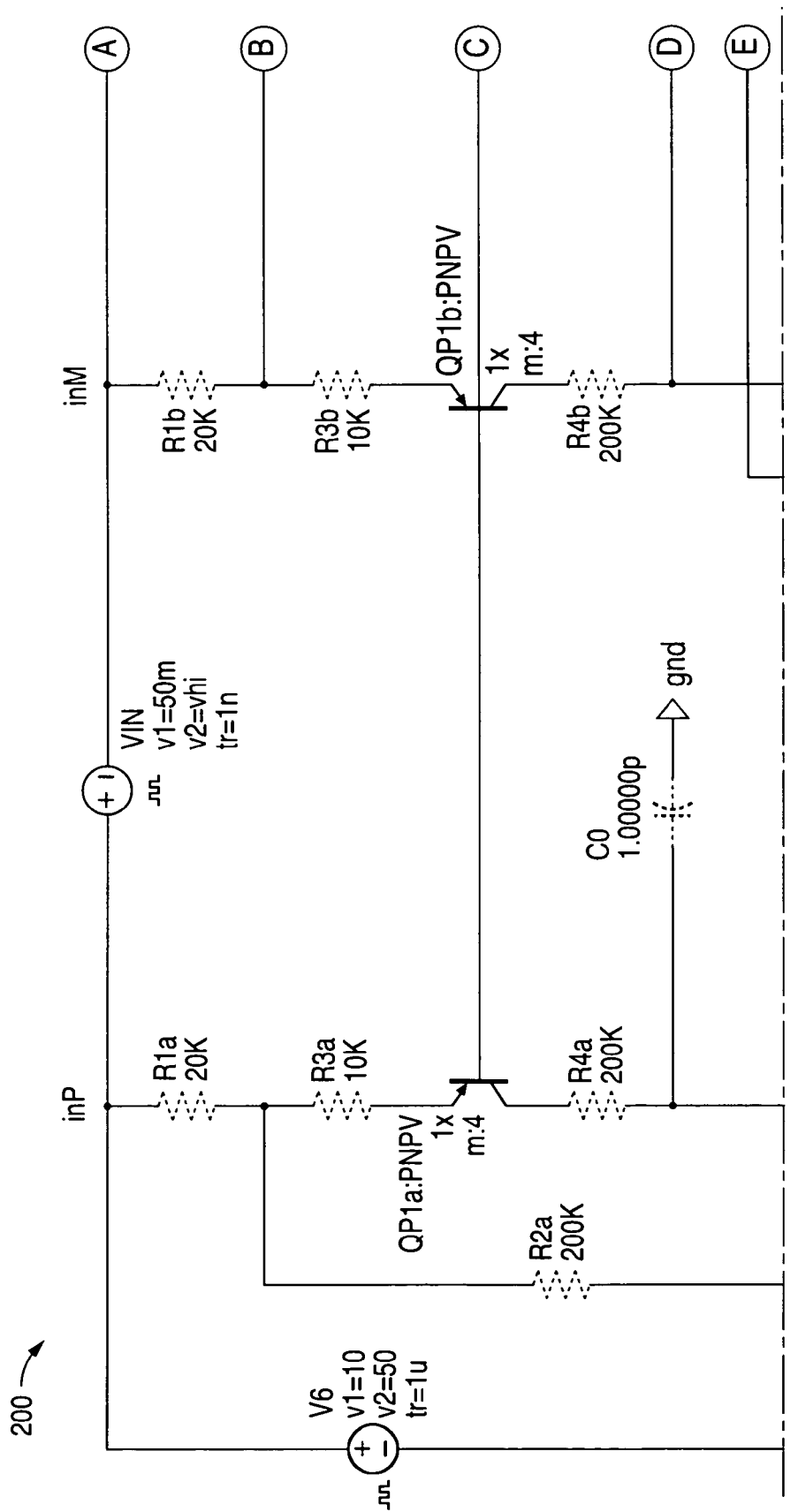
FIG. 2A(1)

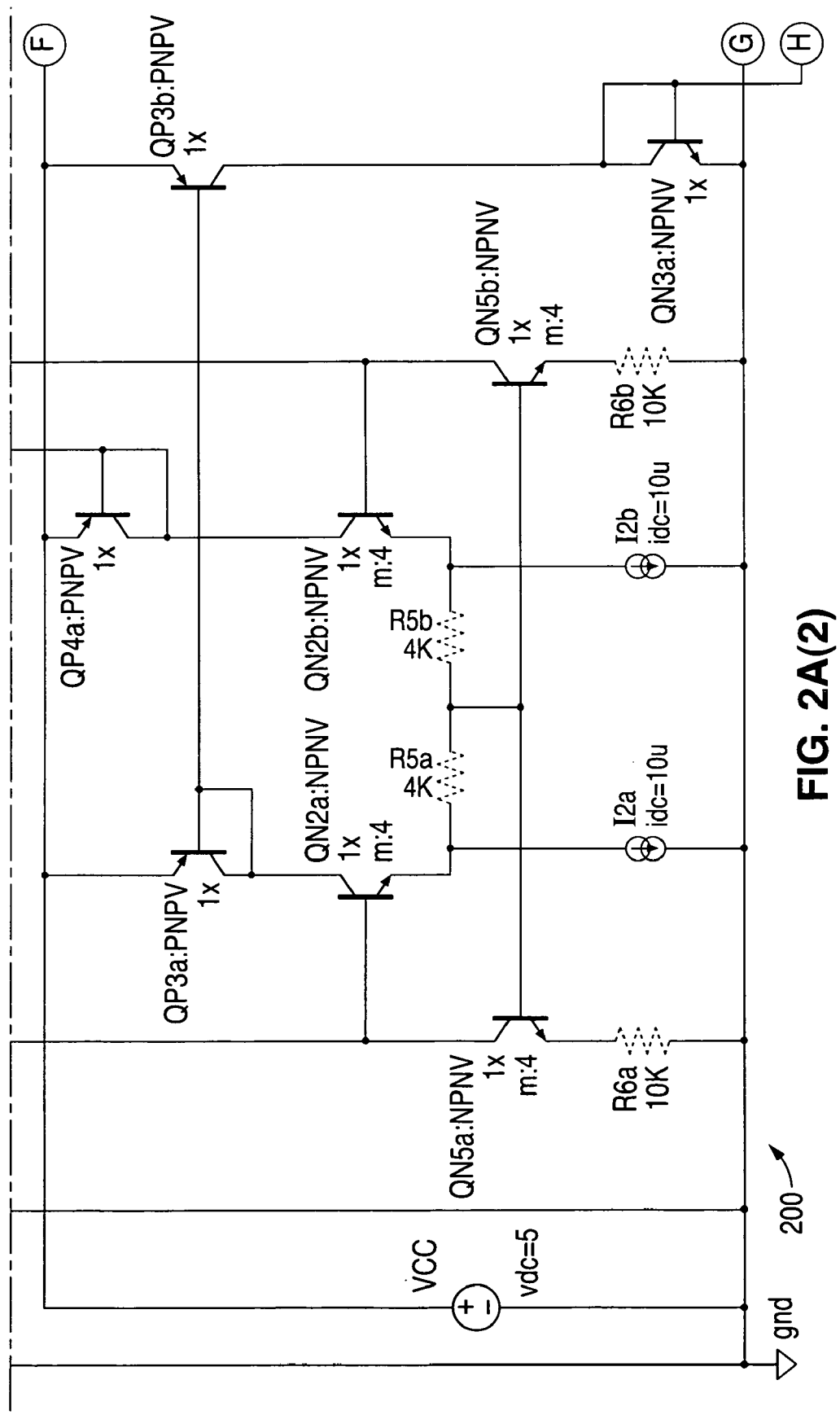
FIG. 2A(2)

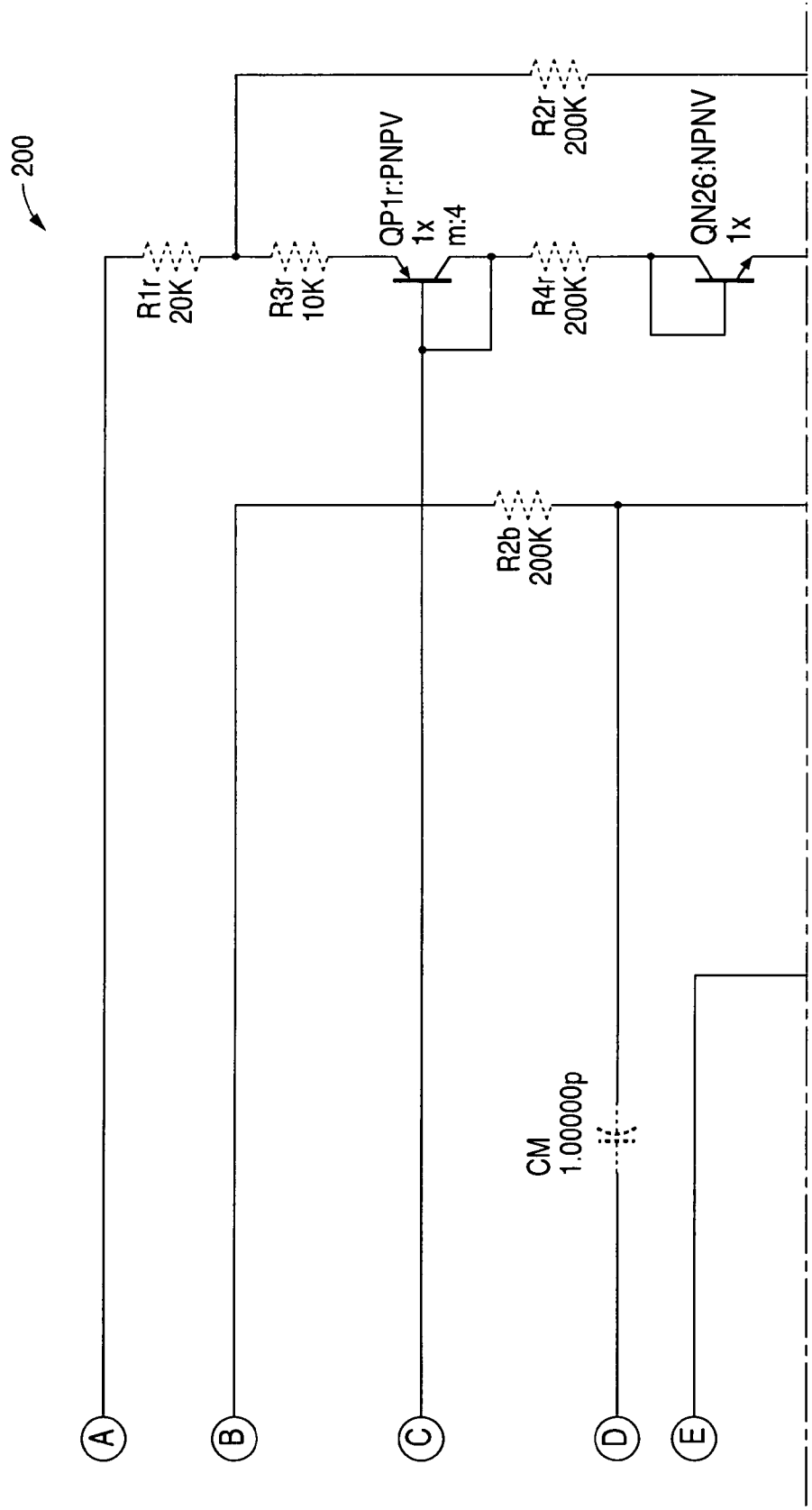
FIG. 2B(1)

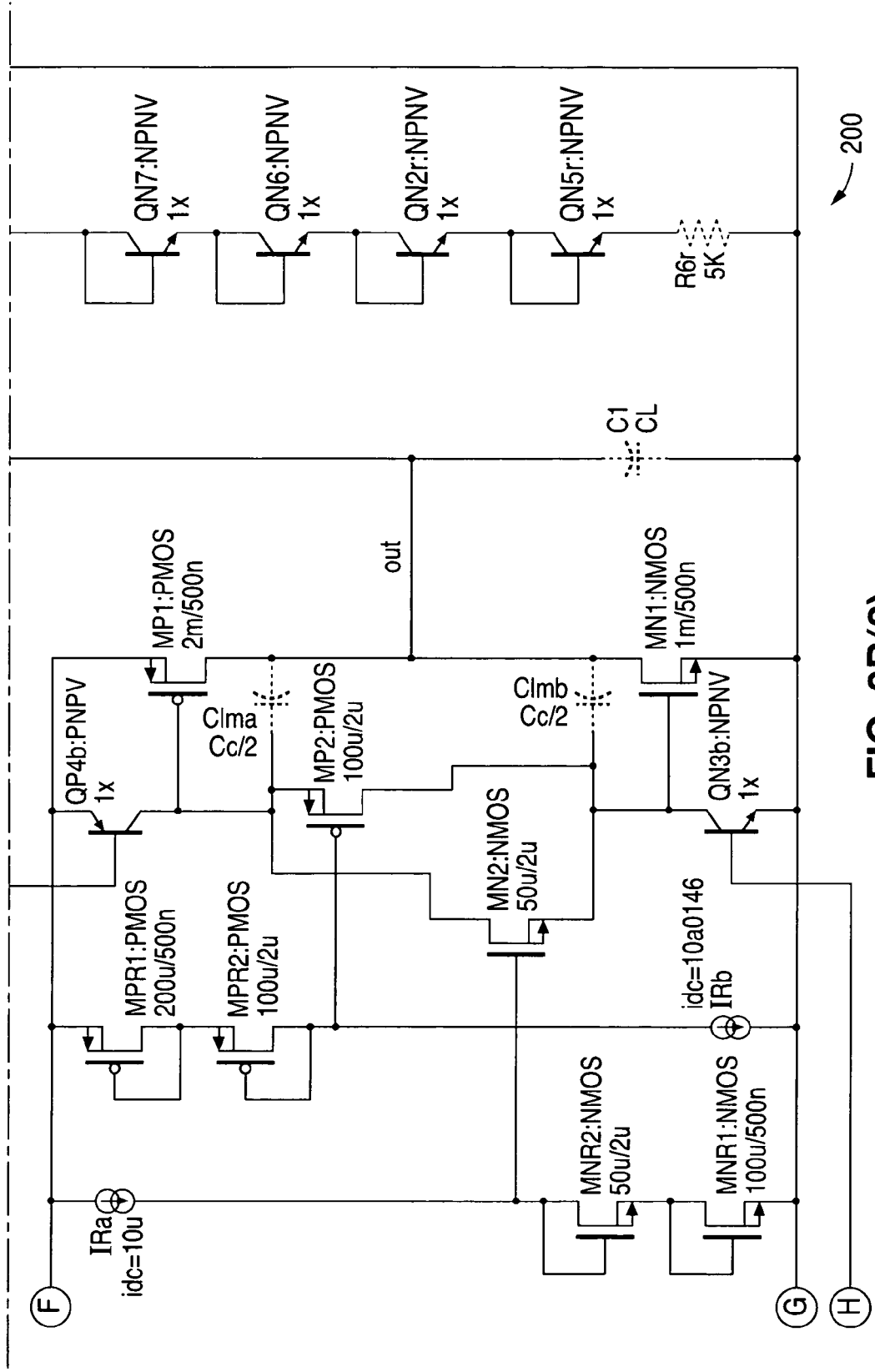
FIG. 2B(2)

CURRENT SENSE AMPLIFIER WITH EXTENDED COMMON MODE VOLTAGE RANGE

TECHNICAL FIELD

This disclosure is generally directed to current sense amplifiers and more specifically to a current sense amplifier with an extended common mode voltage range.

BACKGROUND

In the past several decades, many applications have been developed that require measurements of electrical currents. One convenient technique for measuring a current flowing through a conductor is to insert a small shunt resistor into the current path. The shunt resistor generates a voltage, which is proportional to the amount of current flowing through the shunt resistor. The voltage can be measured by a voltage measurement instrument and used to identify the amount of current. The shunt resistor and the voltage measurement instrument could therefore represent a current measurement instrument.

One advantage of this technique is that the value of the shunt resistor can be modified to adapt the range of the current measurement instrument to the range of currents expected in a particular application. While some power can be dissipated in the shunt resistor, the power loss can be reduced or minimized by reducing the value of the shunt resistor. This, however, reduces the voltage across the shunt resistor and puts more stringent demands on the current measurement instrument.

The current measurement instrument used in this technique often has to measure voltages that are relatively large compared to the supply voltages of modern integrated circuits. For example, a current being measured may be associated with a higher-voltage application (such as 12V, 24V, or even higher). In contrast, a component that processes the current measurements often operates at a lower voltage, such as when a signal representing the current measurements is provided to an analog-to-digital converter (ADC) that uses a supply voltage of 5V, 3.3V, or less. The current measurement instrument therefore needs to amplify a small differential voltage across a shunt resistor and transform it into a signal that is typically ground-referenced (though it could be differential or referenced to another voltage level). At the same time, the current measurement instrument may need to reject a potentially large common mode voltage.

One type of current measurement instrument that can perform these functions is a current sense amplifier. A current sense amplifier generally represents a voltage difference amplifier that is designed for sensing the differential voltage across a shunt resistor while rejecting large input common mode voltages. Current sense amplifiers typically have a voltage gain of between ten and one hundred (although other voltage gains could be used). Also, current sense amplifiers typically have an input common mode voltage range (CMVR) that extends far above, and sometimes also below, their supply rails.

While various types of current sense amplifiers have been developed over the years, they often suffer from various problems. For example, current sense amplifiers implemented using resistive dividers often suffer from offset, noise, and speed/bandwidth problems, and they often require precise trimming of the resistors in the resistive dividers. Other current sense amplifiers have topologies implemented in high-voltage fabrication process technologies. However, these current sense amplifiers are often large, resulting in increased die sizes and higher costs.

BRIEF DESCRIPTION OF THE DRAWINGS

For a more complete understanding of this disclosure and its features, reference is now made to the following description, taken in conjunction with the accompanying drawings, in which:

FIGS. 2A(1), 2A(2), 2B(1), and 2B(2) illustrate more specific details of an example current sense amplifier with an extended common mode voltage range according to this disclosure;

DETAILED DESCRIPTION

FIGS. 1A through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
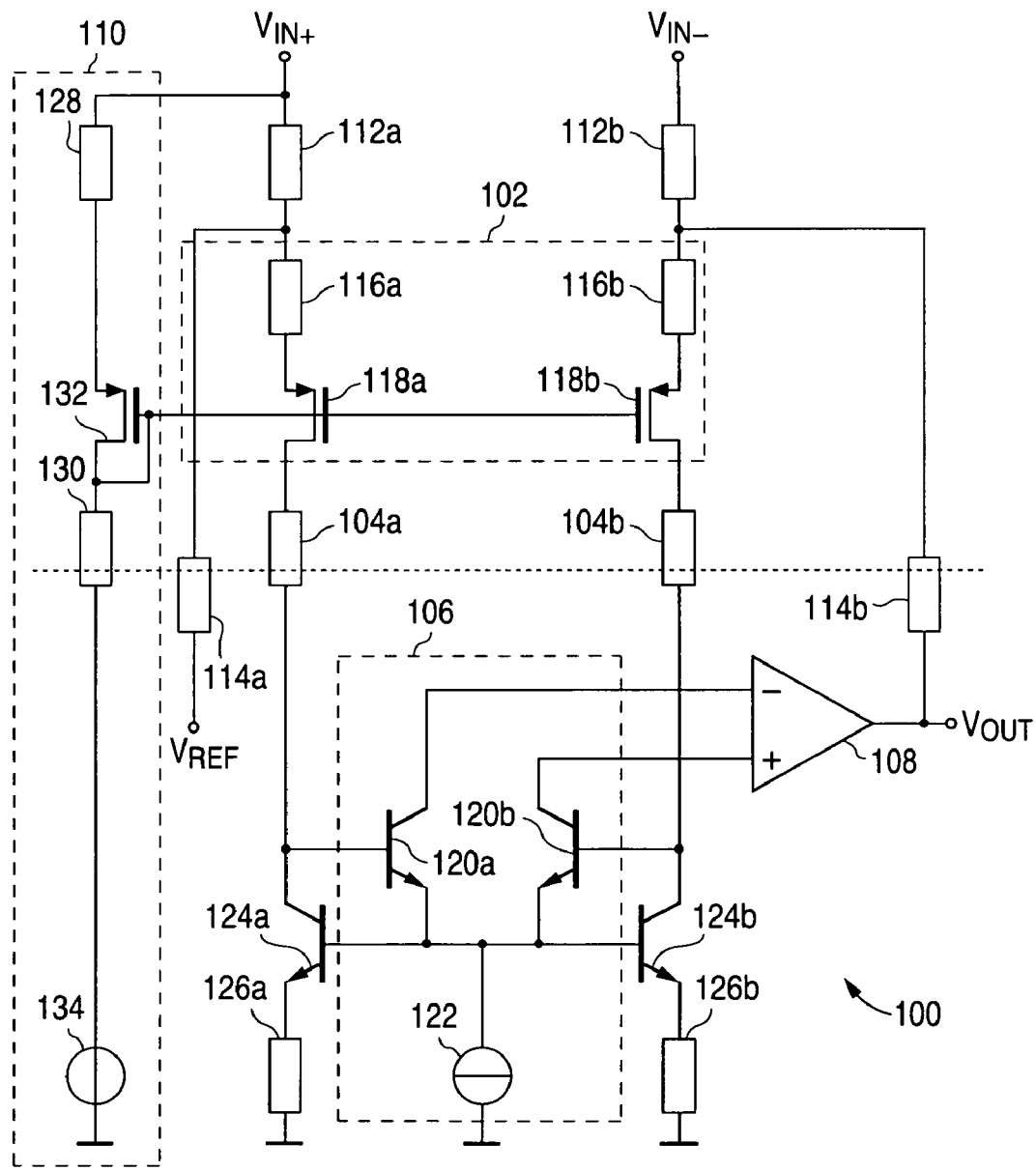
FIGS. 1A through 1C illustrate an example current sense amplifier with an extended common mode voltage range according to this disclosure.
Figure 1B:
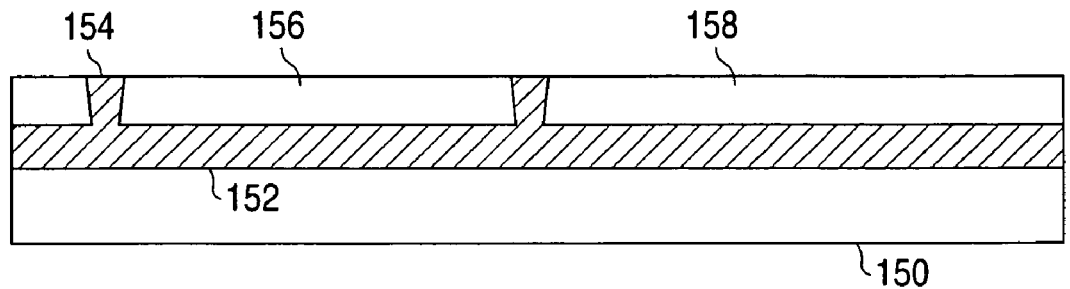
Figure 1C:
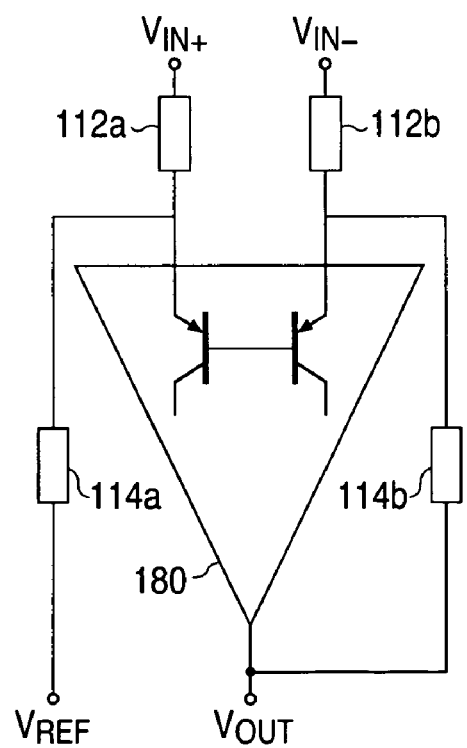

FIGS. 1A through 1C illustrate an example current sense amplifier 100 with an extended common mode voltage range according to this disclosure. The embodiment of the current sense amplifier 100 shown in FIGS. 1A through 1C is for illustration only. Other embodiments of the current sense amplifier 100 could be used without departing from the scope of this disclosure.

As noted above, the current sense amplifier 100 generally operates as a difference voltage amplifier to sense the voltage across a shunt resistor, which allows a measurement of the current flowing through the shunt resistor. In some embodiments, a common mode voltage on the shunt resistor is much larger than the supply voltage of the current sense amplifier 100. The current sense amplifier 100 can therefore operate to produce an output voltage that is proportional to the voltage across the shunt resistor, where the output voltage is referenced to a lower voltage level (such as a reference voltage $V_{REF}$, which could be at or near ground potential). The current sense amplifier 100 can also have an input common mode voltage that extends far beyond its supply rail. In particular embodiments, the current sense amplifier 100 could be designed in a silicon-on-insulator (SOI) high-voltage technology to extend its common mode voltage range beyond the high-voltage process limitations. In this document, the phrase "extended common mode voltage range" can refer to a common mode voltage range that has been extended (i) beyond the supply rail(s) of the current sense amplifier and/or (ii) beyond the intrinsic capabilities of the process in which it is designed.

As shown in FIG. 1A, the current sense amplifier 100 receives a differential input signal (denoted as $V_{IN+}$ and $V_{IN-}$). The differential input signal could, for example, represent the voltage across a shunt resistor or other structure. In general, the current sense amplifier 100 is arranged as a difference amplifier having an open-loop feedback amplifier and a feedback network (which closes the open loop). The open-loop feedback amplifier includes an input stage 102, which provides amplification for an input received by the open-loop feedback amplifier. The amplified input is then provided to two level shifter resistors 104a-104b. The level shifter resistors 104a-104b reduce the voltage of the amplified input, such as by reducing the voltage from a higher level (like 12-60V) to a lower level (such as at or close to a ground potential). However, the terms "higher" and "lower" here are relative and can refer to any other suitable voltage(s). A second stage 106 (often called a transconductance stage) implements a voltage-to-current converter that converts the level-shifted differential input signal into a proportional differential output current. An output stage 108 receives the differential current from the second stage 106 and generates an output voltage $V_{OUT}$ based on the differential current. The output voltage $V_{OUT}$ is generally proportional to the differential input signal, although the amplifier 100 has provided significant gain and the output voltage $V_{OUT}$ is referenced to a lower voltage (a reference voltage $V_{REF}$) compared to the differential input signal. The reference voltage $V_{REF}$ could represent a ground potential or other suitable value. A reference branch 110 provides a reference current through both branches of the input stage 102, which helps to balance the common mode dependent voltage in the input stage 102. The feedback network generally includes two resistors 112a-112b and two additional resistors 114a-114b. The gain provided by the circuit typically depends on the resistances of the resistors 112a-112b and the resistors 114a-114b.

In this example, the input stage 102 includes two resistors 116a-116b and two input transistors 118a-118b. The second stage 106 includes two transistors 120a-120b and a bias current source 122. Two level shifter current source transistors 124a-124b are coupled to the level shifter resistors 104a-104b and to degeneration resistors 126a-126b. The output stage 108 could represent any suitable output stage, such as a CMOS class-AB amplifier. The reference branch 110 includes two resistors 128-130, a transistor 132, and a voltage source 134. The voltage source 134 may replicate a voltage drop across the resistor 126a (and the base-emitter voltages of the transistors 124a-124b and 120a-120b).

In one aspect of operation, the transistors 118a, 118b, 132 function as current mirrors, and the resistor 130 is generally a replica of the level shifter resistors 104a-104b. The reference branch 110 sends a reference current, which is dependent on the input common mode voltage, through the transistor 132. The current is mirrored into the resistors 104a-104b by the transistors 118a-118b. In this way, the common mode dependent voltage across the resistor 130 is copied onto the resistors 104a-104b.

The resistors 104a-104b provide a level shift between the higher common mode voltage at the input stage 102 and the lower voltage in other portions of an integrated circuit (the separation of these two domains is shown as a dashed line in FIG. 1A). For example, the resistors 104a-104b could level shift the input signal received by the input stage 102 to a lower voltage, such as ground potential. The voltage at the bottom end of the resistors 104a-104b in FIG. 1A could also be referenced to the negative supply rail. Because of the level shift voltage introduced across the resistors 104a-104b, the drain voltage of the transistors 118a-118b can track the input common mode voltage.

At the emitters of the transistors 120a-120b, the common mode voltage behind the level shift resistors 104a-104b is detected and fed back on the bases of the level shift current source transistors 124a-124b. The degeneration resistors 126a-126b do not introduce much if any noise because these resistors need not be much smaller than the input resistor 112a-112b. There could be a large amount of noise present on the level shift resistors 104a-104b, but this noise can be absorbed on the drains of the transistors 118a-118b. Any mismatch between the resistors 104a-104b could introduce a small voltage deviation on the drains of the transistors 118a-118b, but this could only result in a second-order effect on the currents flowing through the drains of the transistors 118a-118b because the drains have a relatively high small signal differential impedance.

Without the resistors 116a-116b in the input stage 102, the bias current through the transistors 118a-118b is dependent on the input common mode voltage. As a result, their transconductance is dependent on the common mode as well, which complicates frequency compensation in the circuit. To help reduce or prevent this, the input stage 102 is degenerated with the resistors 116a-116b.

In this example embodiment, the transistors 118a-118b and 132 represent p-channel metal oxide semiconductor (PMOS) transistors. Also, the transistors 120a-120b and 124a-124b represent NPN bipolar junction transistors. It may be noted that any suitable transistors could be used here. In addition, the various resistors in FIG. 1A could have any suitable resistances to provide desired functionality.

In particular embodiments, the current sense amplifier 100 could be implemented on a silicon-on-insulator (SOI) substrate or other substrate having an isolated portion. An example of this is shown in FIG. 1B, where a buried insulator layer 152 and vertical trenches 154 (such as oxide-filled trenches) in a silicon substrate 150 isolate at least one portion 156 of the substrate from at least one other portion 158 of the substrate. Various components of the current sense amplifier 100 could then be formed in or over the isolated portion(s) 156 of the substrate 150 (such as the input transistors 118a-118b) and in or over the other portion(s) 158 of the substrate 150 (such as the lower-voltage components of the amplifier 100). As particular examples, each of the input transistors 118a-118b could be isolated by its own trench (so that there are multiple isolated portions 156 at high potential), or a single trench could surround the high-voltage input transistors 118a-118b. Among other things, this allows the transistors 118a-118b to be oxide-isolated from the substrate. This also allows the transistors 118a-118b (such as low-voltage 5V MOSFET transistors) to be used, while the terminals of the transistors are higher (such as close to 60V) relative to the substrate. Because of the voltage drop across the level shifter resistors 104a-104b, the MOSFET transistors can handle this voltage difference. The resistors 112a-112b and the level shifter resistors 104a-104b can also be isolated using, for example, thin film resistors or polysilicon resistors (since they are automatically isolated by a dielectric layer and have no junctions to the substrate 150). As a particular example, the current sense amplifier 100 could be formed using the VIP50 SOI process from NATIONAL SEMICONDUCTOR CORP.

The use of an SOI substrate allows active components to be floated in oxide-isolated tubs (the isolated portion 156) at high potential relative to the substrate 150. Using SOI, it is possible to operate components at voltages that are very high compared to the voltage applied to the substrate, which is typically connected to ground potential. As long as the potential difference between the terminals of the active components is limited, the terminals can be moved to a high voltage relative to the substrate. This allows the use of low-voltage components at high common mode levels to create gain before the signals are level shifted to the low voltage domain using resistors. Since the level shift can introduce performance losses (such as by adding error sources), amplifying the signal prior to the level shift can allow the errors introduced by the level shifting to have less effect. In addition, the gain that is realized at high common mode levels need not be very accurate or well controlled, as long as the gain is part of a high gain amplifier that is part of a feedback circuit. Here, the feedback occurs "in front" of the input stage (prior to amplification). As a result, the floating input stage (at high voltage) does not have to be very accurate. As long as it provides some gain, the subsequent stages also provide gain, and the overall current sense amplifier 100 is highly accurate.

Note that the use of SOI to isolate components of the current sense amplifier 100 is for illustration only. Other techniques could be used to isolate components of the current sense amplifier 100. For example, low-voltage components having junction isolation to the substrate could also be used (such as for the transistors 118a-118b), where the junction breakdown voltage of the junctions to the substrate is sufficiently high to block the high input common mode voltage.

In effect, the current sense amplifier 100 shown in FIG. 1A has the form shown in FIG. 1C. Here, the current sense amplifier 100 includes a feedback network (formed by the resistors 112a-112b and 114a-114b in FIG. 1A) and an open-loop feedback amplifier 180 (formed by the other components in FIG. 1A). The resistors 112a-112b may be called input resistors, and the resistors 114a-114b may be called feedback resistors. In FIG. 1C, the amplifier 180 and the feedback network implement a fixed-gain amplifier with a gain that is determined by a resistor ratio (defined by the resistance of the feedback resistors divided by the resistance of the input resistors). Also, the differential input signal ($V_{IN+}$ and $V_{IN-}$) is "gained up" by this resistor ratio, while the input to the amplifier 180 is generally regulated to zero by the feedback network. Ideally, the gain of the amplifier 180 is infinite, and the feedback is negative so that the input voltage on the inputs to the amplifier 180 becomes zero.

One way to view the input stage 102 of the amplifier 100 is that it includes "composite" transistors (such as standard transistors in SOI or other isolated regions of the substrate plus level shifter resistors). These "composite transistors" are biased so that the voltage drop across the level shifter resistors is the right value to shift the input signal from (approximately) the input common mode voltage to the lower supply voltage (or somewhere in between the amplifier's supply voltage rails).

Although FIGS. 1A through 1C illustrate one example of a current sense amplifier 100 with an extended common mode voltage range, various changes may be made to FIGS. 1A through 1C. For example, various components in FIG. 1A could be replaced with other components for performing similar or equivalent functions. As a particular example, the voltage source 134 could be replaced with two diodes and a resistor for replicating the voltage across the resistor 126a (and the base-emitter voltages of the transistors 124a-124b and 120a-120b). Also, additional components could be added to the current sense amplifier 100 to provide desired functionality, such as by including frequency compensation capacitors. In addition, while shown as a three-stage amplifier, the current sense amplifier 100 could have any suitable number of stages.

FIGS. 2A(1), 2A(2), 2B(1), and 2B(2) illustrate more specific details of an example current sense amplifier 200 with an extended common mode voltage range according to this disclosure. The embodiment of the current sense amplifier 200 shown in FIGS. 2A(1), 2A(2), 2B(1), and 2B(2) is for illustration only. Other embodiments of the current sense amplifier 200 could be used without departing from the scope of this disclosure.

The current sense amplifier 200 shown in FIGS. 2A(1), 2A(2), 2B(1), and 2B(2) may operate in the same or similar manner as the current sense amplifier 100 shown in FIGS. 1A through 1C. Here, resistors R1a, R1b, R2a, and R2b are feedback resistors, and other components implement an operational amplifier. In this manner, a standard difference amplifier circuit can be created. The amplifier receives a voltage between two nodes inM and inP (represented by voltage sources V6 and VIN). An output voltage is fed back using the resistors R1a, R1b, R2a, and R2b. The feedback resistors R2a and R2b cross between the lower and higher voltage domains. The matching between an R1b/R2b ratio and an R1a/R2a ratio may drive the common mode rejection ratio (CMRR) performance of the current sense amplifier 200.

The current sense amplifier 200 can operate with very high common mode voltages at its input. It may draw a large common mode input bias current and have a relatively low input impedance (operational amplifiers often have very high input impedances). Because the current sense amplifier 200 can be driven from very low impedance sources, a low input impedance is not a drawback here. Also, high input bias currents are typical for current sense amplifiers.

Transistors QP1a and QP1b and resistors R3a and R3b act as the input pair of the amplifier. The transistors QP1a and QP1b can be seen as a differential input stage that is driven at its emitters instead of at its bases. A bias current through transistors QP3a and QP3b can vary with the input common mode voltage and can be rather high. Without the resistors R3a and R3b, this could cause the transconductance of the input stage to be high and to vary with the input common mode voltage, which may create issues with feedback loop stability. For that reason, the input stage can be degenerated with the resistors R3a and R3b. The transconductance of the input stage may therefore be reduced to approximately 1/R3 (where R3 represents the approximately equal values of R3a and R3b), so the transconductance can be (almost) independent of the input common mode voltage.

Resistors R4a and R4b represent the level shifter resistors. A bias current through the resistors R4a and R4b can be set so that sufficient potential drops across the resistors R4a and R4b. This allows the components below the resistors R4a and R4b to see smaller voltages, while the collectors of the transistors QP1a and QP1b can be kept close to their bases and emitters (preventing these transistors from being damaged by electrical overstress).

Transistors QN5a and QN5b and resistors R6a and R6b represent degenerated load current sources below the transistors QP1a and QP1b. The collectors of the transistors QP1a, QP1b, QN5a, and QN5b are connected through the level shifter resistors R4a and R4b. The nodes on both sides of the resistors R4a and R4b represent a first high-impedance node of the amplifier. The voltage gain from the input to these nodes can equal the transconductance of the input stage (1/R3) times the impedance seen into the collectors of the transistors QP1a, QP1b, QN5a, and QN5b. Because these are degenerated bipolar current sources, this impedance can be very high, and a high voltage gain can be achieved.

Transistors QN2a and QN2b and resistors R5a and R5b represent the second (transconductance) stage. The transistors QN2a and QN2b are biased by current sources 12a and 12b. The differential output current of the second stage is mirrored with the transistors QP3a and QP3b and with transistors QN3a and QN3b, as well as with transistors QP4a and QP4*b* into a mesh (transistors MN2 and MP2) of a standard CMOS class-AB output stage. Transistors MP1 and MN1 represent output drivers of the output stage. Transistors MPR1, MPR2, MNR4, and MNR2 are reference diodes that set the quiescent current in the output stage. The mesh is driven with two current sources (IRa and IRb). Together with the transconductance of the second stage, this creates the second gain stage in the amplifier. The final gain is achieved by the transconductance of the output stage into a load resistor. Here, the load resistor is the feedback network only, while in practice there can be an additional load or load capacitor (denoted CL below).

The components on the right hand side of FIGS. 2B(1) and 2B(2) (resistors R1*r*, R2*r*, R3*r*, R4*r*, and R6*r*; and transistors QP1*r*, QN2*r*, QN5*r*, QN6, QN7, and QN26) represent a reference branch that establishes a bias current. This bias current is mirrored from the transistor QP1*r* to the transistors QP1*a* and QP1*b*. This copies the voltage drop on the resistor R4*r* onto the resistors R4*a* and R4*b*. In this manner, the resistors R4*a* and R4*b* implement floating voltage sources with a level shift voltage that is providing the drop required to level shift the signal from the collectors of the transistors Qp1*a* and QP1*b* to the collectors of the transistors QN5*a* and QN5*b*. The voltage can be fixed on one side of these floating voltage sources to prevent the potentials on the collectors of the transistors QP1*a*, QP1*b*, QN5*a*, and QN5*b* from being undetermined. Fixing the voltage on one side can be achieved with common mode feedback by connecting the mid-point between the emitters of the transistors QN2*a* and QN2*b* to the bases of the transistors QN5*a* and QN5*b*. The common mode equivalent of the circuit around the transistors QN2*a*, QN2*b*, QN5*a*, and QN5*b* is a bipolar current mirror with a beta helper.

The reference diodes help to ensure that the voltage on the collectors of the transistors QP1*a* and QP1*b* is a few diodes below their emitters. In this manner, the transistors QP1*a* and QP1*b* are biased properly. If the level shifter resistors R4*a* and R4*b* do not match perfectly, a mismatch can occur between the collector voltages of the transistors QP1*a* and QP1*b*. Since the collectors of the transistors QP1*a* and QP1*b* are high impedance nodes, a small imbalance between the collector voltages may not have a large impact on the circuit performance. Because of this, precise and exact matching of the level shifter resistors R4*a* and R4*b* may not be critical because the collectors simply absorb the imbalance without affecting (to first-order) the differential current flowing in the circuit. A voltage source VCC (5V here) represents the supply voltage for various components in FIGS. 2A(1), 2A(2), 2B(1), and 2B(2).

Stability in the current sense amplifier 200 can be achieved in this example with nested Miller compensation. The dominant pole is set by the transconductance of the input stage and a Miller capacitor CM. A capacitor C0 is inserted to balance the circuit at high frequencies. The second pole is set by the transconductance of the second stage and local Miller capacitors Clma and Clmb around the output drivers. For stability analysis, the capacitors Clma and Clmb may be considered to be placed in parallel and have a common value denoted Clm. The output pole is located at the transconductance of the output stage divided by a load capacitance CL. Typically, to ensure stability in a three-stage nested Miller compensated amplifier, the design equation can be expressed as:

$$\frac{g_{min}}{CM} = \frac{1}{2}\frac{g_{m2}}{Clm} = \frac{1}{4}\frac{g_{mout}}{CL}. \quad (1)$$

Here, $g_{min}$, $g_{m2}$ and $g_{mout}$ represent the transconductances of the input, second, and output stages, respectively. For the current sense amplifier 200, this can be translated into:

$$\frac{1}{CM \cdot R_3} = \frac{1}{2 \cdot Clm \cdot R_5} = \frac{g_{mout}}{4CL}. \quad (2)$$

Achieving this condition is quite manageable.

To ensure proper dynamic settling during slewing conditions, the slew rate can be limited by the signal current flowing from the first stage into the main Miller capacitor CM. The slew rate of the second stage into the local Miller capacitors Clma and Clmb should be larger. If this is not the case, during slewing, the second stage can "go open loop," and a large differential voltage may develop across the input of the second stage. Once the output reaches its final voltage, the large differential signal at the input of the second stage can still be present. As a consequence, the output may overshoot its final value. To achieve proper slewing behavior, the design of the amplifier should ensure that the maximum signal current from the input stage into the main Miller capacitor divided by that capacitor is smaller than the maximum current from the second stage into the local Miller capacitors divided by those capacitors.

Because a differential signal is applied to the emitters of the input stage, the differential current leaving the input stage can be rather large, meaning the slew rate can be quite high. Because the second stage should slew faster than the input stage, the bias current of the second stage should be high. Typically, this would increase the transconductance of the second stage and move the pole associated with that stage, which could lead to stability issues unless the output pole is also positioned very high. To reduce or avoid this problem, the resistors R5*a* and R5*b* can be introduced in the second stage. These resistors R5*a* and R5*b* degenerate the second stage, reducing its transconductance. Effectively, this decouples the transconductance of the second stage (which now equals 1/R5, where R5 represents the approximately equal values of R5*a* and R5*b*) from the bias current through the second stage (which may be high to achieve a larger slew rate than the input stage). This additional degree of design freedom may allow the orthogonal optimization of small signal AC response and large signal step response.

The maximum slewing current of the input stage may occur when a large input signal step occurs. It can be assumed that the maximum input step equals the maximum output voltage (the supply voltage VCC) divided by the gain. The maximum signal current therefore may equal the maximum input voltage divided by the sum of R1 (representing the approximately equal R1*a* and R1*b*) and R3. This current into the main Miller capacitor should be smaller than the bias current of the second stage into the local miller capacitors, which may result in:

$$\frac{VCC}{G \cdot (R1 + R3) \cdot CM} \leq \frac{I2b}{Clm}. \quad (3)$$

In particular embodiments, the current sense amplifier 200 is implemented using an SOI substrate (such as that shown in FIG. 1B) so that low-voltage active components floating at a higher voltage can be used. In these embodiments, the current sense amplifier 200 can share most or all of the advantages of current sense amplifiers fabricated in high-voltage process technologies, but it does not require an actual high-voltage fabrication process. It does involve using an SOI process, such as the VIP50 process (which is very suitable to realize this circuit). Compared to a high-voltage process current sense amplifier, the current sense amplifier 200 may need good resistor-matching to achieve high CMRR, but this is already achieved regularly in commercially-available products. One big advantage of the current sense amplifier 200 is that it allows the integration of other circuit blocks (such as an analog-to-digital converter) with the current sense amplifier 200, which may not be cost-effective in a high-voltage process.

When implementing the current sense amplifier 200, the active components near the boundary between the two voltage domains can be properly protected in various conditions, such as power-up and fast transient conditions. This protection can be achieved, for example, by adding protection diodes at appropriate locations in the circuit.

The current sense amplifier 200 shown in FIGS. 2A(1), 2A(2), 2B(1), and 2B(2) works for input common mode voltages that are relatively high above ground. The circuit in this arrangement may not sense below the negative rail, which could be a requirement in some (but not all) current sense applications, it is possible to dimension the current sense amplifier 200 so that is works down to mid-supply, in which case a complementary implementation of this topology can work from input common mode voltages far below ground up to mid-rail. Combining these two complementary stages into a stage that operates outside both supply rails could therefore be developed.

A particular implementation of the current sense amplifier 200 could be done as follows. In this particular implementation, R2a=R2b=200 kOhm and R1a=R1b=20 kOhm for a gain of ten. Also, R3a=R3b=10 kOhm for an input transconductance of 100 uA/V, and R4a=R4b=200 kOhm. This approximately sets the common mode input impedance. The reference branch may add to the input impedance and create an imbalance between the input impedance on the two inputs, which can be corrected by splitting the resistor R1r into two resistors of twice the value and connect one to each input. Further, CM=1 pF for setting the open-loop unity gain bandwidth of the amplifier at 16 MHz, and R5a=R5b=4 kOhm for setting the transconductance of the second stage at 250 µA/V. Moreover, Clm=1 pF for setting the second pole at 40 MHz, well in excess of twice the open-loop unity gain bandwidth. In addition, gmout=12 mA/V, which follows from a quiescent current in the output stage that is set at 250 µA. The output pole for a 20 pF pole occurs at 95 MHz, which is well above twice the location of the second pole. The amplifier 200 here has good phase margins for capacitive loads below 20 pF. The quiescent current of the bias currents of the second stage (I2a and I2b) are set at 10 µA. Note that the step response is likely to slew without overshoots. The slew rate of the input stage is 500 mV/(10 kOhm+20 kOhm)/1 pF=17V/µs. The slew rate of the second stage is 20 µA/1 p=20V/µs. For large transient steps on the input, the slew rate is properly limited by the given dimensioning in the input stage.

Although FIGS. 2A(1), 2A(2), 2B(1), and 2B(2) illustrate more specific details of an example current sense amplifier 200, various changes may be made to FIGS. 2A(1), 2A(2), 2B(1), and 2B(2). For example, various components in FIGS. 2A(1), 2A(2), 2B(1), and 2B(2) could be replaced with other components for performing similar or equivalent functions.

Also, while shown as a three-stage amplifier, the current sense amplifier 200 could have any suitable number of stages.

Figure 3:
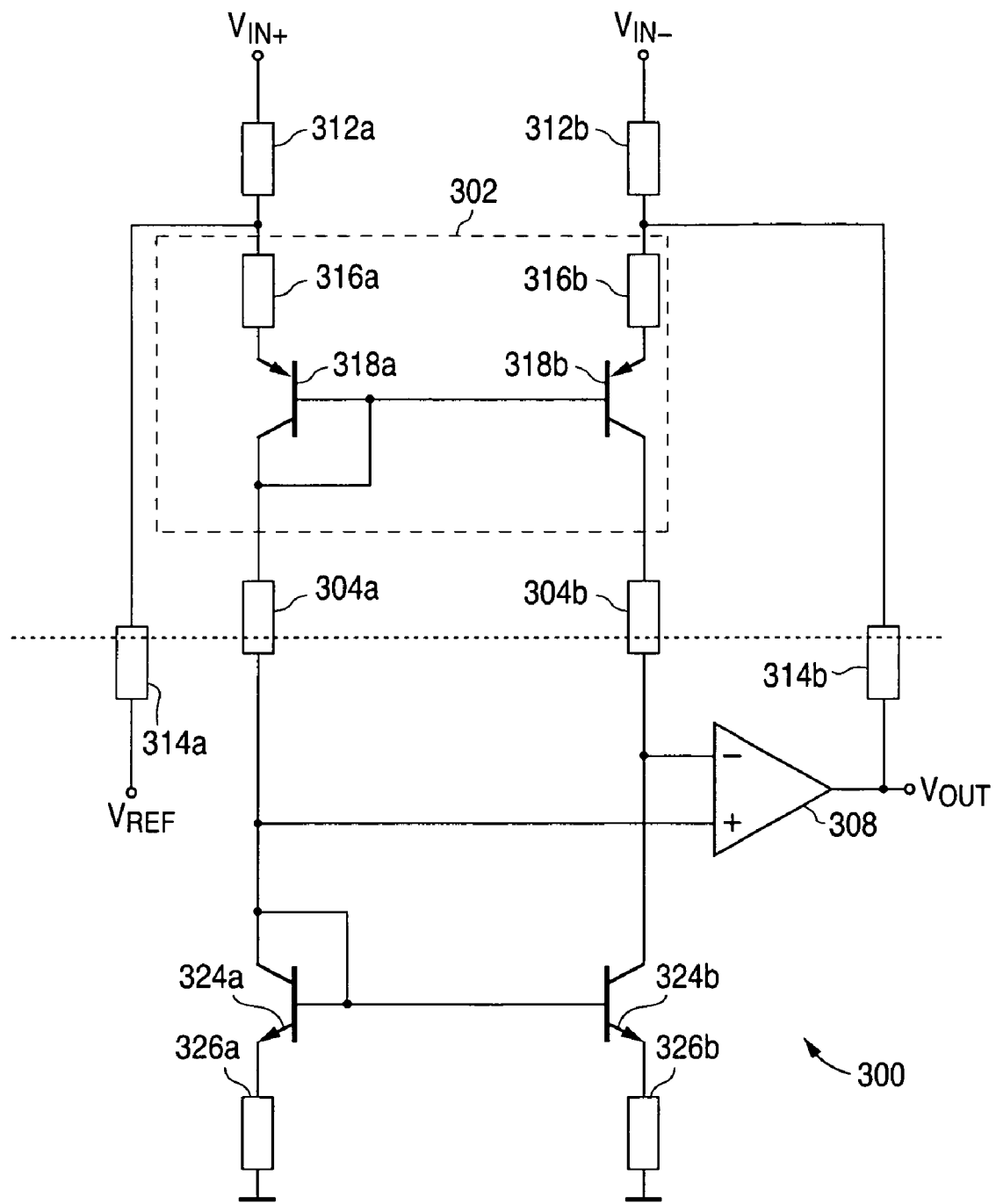
FIG. 3 illustrates another example current sense amplifier with an extended common mode voltage range according to this disclosure.

FIG. 3 illustrates another example current sense amplifier 300 with an extended common mode voltage range according to this disclosure. The embodiment of the current sense amplifier 300 shown in FIG. 3 is for illustration only. Other embodiments of the current sense amplifier 300 could be used without departing from the scope of this disclosure.

In this example, the current sense amplifier 300 shares several similar components as the current sense amplifier 100. For example, the current sense amplifier 300 is arranged as a difference amplifier having an open-loop feedback amplifier and a feedback network. The open-loop feedback amplifier includes an input stage 302, level shifter resistors 304a-304b, and an output stage 308. The feedback network includes two input resistors 312a-312b and two additional resistors 314a-314b. The input stage 302 includes resistors 316a-316b and transistors 318a-318b. In this embodiment, the transistors 318a-318b represent PNP bipolar junction transistors. The resistor 314a is coupled to a reference voltage $V_{REF}$ and between the resistors 312a and 316a, and the resistor 314b is coupled to an output voltage $V_{OUT}$ and between the resistors 312b and 316b. Two transistors 324a-324b are coupled to the level shifter resistors 304a-304b and to resistors 326a-326b.

In this embodiment, a reference branch has been combined with an input stage branch. The reference branch (included in the left branch of the input stage 302) sets up a reference current in the reference branch that is dependent on the input common mode voltage. Note that the output reference voltage ($V_{REF}$) also affects this current.

If there is an input signal, the circuit is not balanced, and the right branch of the input stage 302 runs at a different current. As a result, the collector of the transistor 324a is slightly higher or lower than the collector of the transistor 324b. The input stage 302 is a first $g_m*R_o$ gain stage, where $g_m$ is the transconductance of the R5/Q1 input stage (R5 represents the approximately equal values of the resistors 316a-316b, and Q1 represents the transistors 318a-318b) and $R_o$ is the impedance seen looking into the collector of the transistor 324b in parallel with the impedance seen looking into the collector of the transistor 318b.

The second stage of the amplifier 300 is the output stage 308, which could represent a single-stage operational amplifier or a multiple-stage operational amplifier. In perfect balance, $V_{IN+}=V_{IN-}$ and $V_{OUT}=V_{REF}$. When an input voltage is present, $V_{OUT}=V_{REF}+(R3/R1)*(V_{IN+}-V_{IN-})$ (where R1 represents the approximately equal values of the resistors 312a-312b, and R3 represents the approximately equal values of the resistors 314a-314b).

When an input signal is present, the base emitter voltages of the transistors 318a-318b are initially slightly mismatched. As a result, there is an amplified voltage difference present between the collectors of the transistors 324a-324b. This differential voltage is further amplified by the second stage (and possibly other stages). As a result, the output voltage $V_{OUT}$ will increase to a large extent, providing high gain amplification. This output voltage movement acts to counterbalance the input signal that started the chain of events using feedback. In the end, the output voltage $V_{OUT}$ can exactly balance the input voltage so that the differential voltage at the high-voltage input stage 302 equals zero. In other words, the voltage at the node where the resistors 312a, 314a, 316a connect equals the voltage at the node where the resistors 312b, 314b, 316b connect. This occur if $(V_{IN+}-V_{IN-})/R1$ equals $(V_{OUT}-V_{REF})/R3$.

This embodiment of the current sense amplifier 300 may share various features with the current sense amplifier 100. For example, both may have active elements (transistors 318a-318b in FIG. 3) that float in an SOI tub close to a high input common mode voltage. Both include level shifter resistors, and both amplify an input signal prior to level shifting. Both include mechanisms for helping to ensure that the level shifter resistors have a voltage that provides an input common mode-dependent level shift between the high input common mode voltage and the low supply voltage. Both include a feedback system where the floating high-voltage input stage can be seen as the first gain stage of the forward high-gain amplifier, and both include a feedback network that closes the feedback loop.

Although FIG. 3 illustrates another example of a current sense amplifier 300 with an extended common mode voltage range, various changes may be made to FIG. 3. For example, various components in FIG. 3 could be replaced with other components for performing similar or equivalent functions. Also, as noted above, while shown as a two-stage amplifier, the current sense amplifier 300 could have any suitable number of stages.

FIGS. 4A through 4D illustrate example systems using a current sense amplifier with an extended common mode voltage range according to this disclosure. The embodiments of the systems shown in FIGS. 4A through 4D are for illustration only. A current sense amplifier with an extended common mode voltage range could be used in any other or additional system without departing from the scope of this disclosure.

Figure 4A:
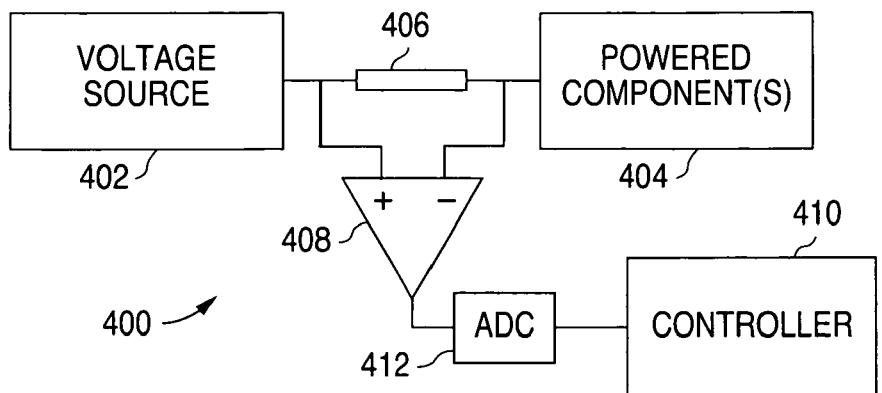
FIGS. 4A through 4D illustrate example systems using a current sense amplifier with an extended common mode voltage range according to this disclosure.

FIG. 4A illustrates an example system 400 that includes a voltage source 402 and one or more powered components 404. The voltage source 402 could generally represent any suitable device for storing or supplying a voltage, such as a battery in a laptop computer or other electronic device or a battery in a hybrid car or other vehicle. The voltage source 402 could also represent a fuel cell or other charge-storage device. The voltage source 402 could further represent a linear voltage regulator, a switching voltage regulator, or other device configured to provide a voltage. The powered components 404 represent any suitable circuits or other components that receive at least some operating power from the voltage source 402 or otherwise consume power from the voltage source 402. The powered components 404 could, for instance, represent integrated circuits in a laptop computer or other electronic device or electrical components in a hybrid car or other vehicle.

A shunt resistor 406 is coupled along a current flow path between the voltage source 402 and the powered components 404. The shunt resistor 406 represents any suitable resistor or other resistive structure and may have a small resistance. A voltage across the shunt resistor 406 is measured by a current sense amplifier 408, which could represent the current sense amplifier 100 of FIG. 1 or the current sense amplifier 200 of FIG. 2 (or any other suitable current sense amplifier). The current sense amplifier 408 generates an output signal that is proportional to the voltage across the shunt resistor 406.

The output signal from the current sense amplifier 408 could be used in any suitable manner. For example, the output signal could be provided to a controller 410. If necessary, an analog-to-digital converter (ADC) 412 could be used to digitize the output signal from the current sense amplifier 408 and to provide digital values to the controller 410.

The controller 410 could use the output from the current sense amplifier 408 to perform any suitable function. For example, the controller 410 could adjust the operation of the voltage source 402, the powered components 404, or other components in the system 400 based on the amount of current being provided by the voltage source 402. The controller 410 could also use the output from the current sense amplifier 408 to measure the charge or discharge current of the voltage source 402 (which could be rechargeable), where knowledge of the current could be used to extend battery life or enhance battery safety.

Figure 4B:
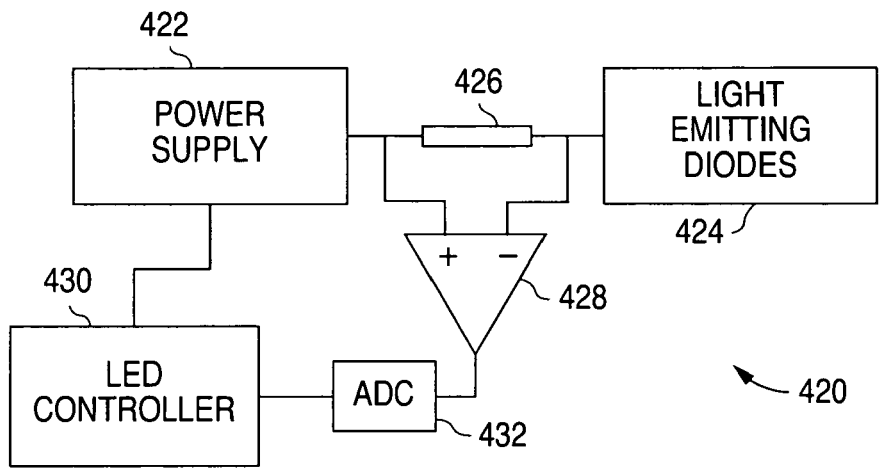

FIG. 4B illustrates an example system 420 that includes a power supply 422 and one or more light emitting diodes (LEDs) 424. The power supply 422 generally represents a battery or other power source for providing power to activate the light emitting diodes 424. A shunt resistor 426 is coupled along a current flow path between the power supply 422 and the light emitting diodes 424. A voltage across the shunt resistor 426 is measured by a current sense amplifier 428 (which could represent the current sense amplifier 100, 200, or 300). An output signal from the current sense amplifier 428 is provided to an LED controller 430, possibly through an ADC 432 (although an analog signal from the current sense amplifier 428 could be provided to the LED controller 430). The LED controller 430 could use the measured current through the shunt resistor 426 to estimate the luminosity of the light emitting diodes 424 (since their luminosity is proportional to the current). The LED controller 430 could then control the power supply 422 to adjust the brightness of the light emitting diodes 424.

Figures 1, 4C:
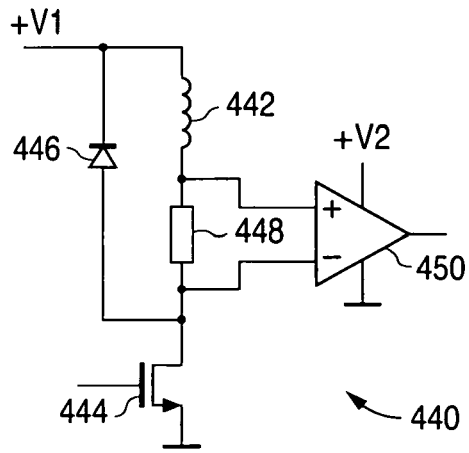
Figures 2, 4C:
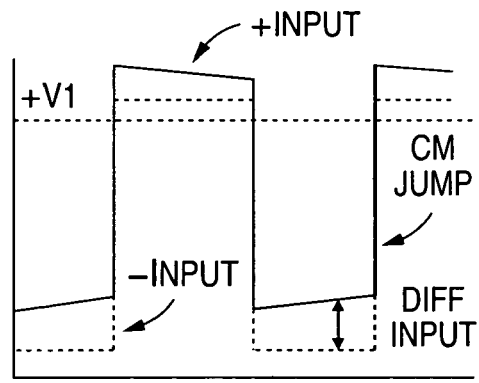

FIGS. 4C-1 and 4C-2 illustrate an example automotive or industrial application involving the use of a motor. In this example, a system 440 includes a solenoid 442 receiving an input +V1 (such as a +24V signal). A switch 444 (such as a power MOSFET switch) is coupled in series with the solenoid 442, and the switch 444 can receive a pulse width modulated control signal. A freewheeling diode 446 is coupled in parallel with the solenoid 442 and a shunt resistor 448. A voltage across the shunt resistor 448 is measured by a current sense amplifier 450, which could output values associated with the measured voltage to an ADC, a controller, or other destination. The current sense amplifier 450 receives a supply voltage +V2, which is typically less than the input +V1 and could be +5V, for instance.

When the switch 444 is on, the solenoid 442 is connected to a power source providing the input +V1 (such as a battery), and the current through the solenoid 442 increases gradually. During this time, the common mode voltage on the shunt resistor 448 is close to ground potential. When the switch 444 is off, the current through the solenoid 442 flows in a mesh created by the solenoid 442, the shunt resistor 448, and the diode 446. During this time, the current gradually decreases because of power losses inside the mesh. Because of the voltage drop across the diode 446, during this period the common mode voltage across the shunt resistor 448 is slightly above the voltage +V1.

In this and other applications, the common mode voltage seen at the current sense amplifier 450 may not only be large but also include a very large AC component. This occurs, for instance, when controlling the current through the solenoid 442 using the switch 444 and pulse width modulation. As shown in FIG. 4C-2, the voltage seen at the input to the current sense amplifier 450 may swing between positive and negative input voltages. While the differential voltage seen at the current sense amplifier 450 may be small, the input voltage experiences large common mode jumps between the positive and negative inputs. The current sense amplifier 450 (which could represent the current sense amplifier 100, 200, or 300) could completely reject the large varying common mode voltage while amplifying and level shifting the small differential voltage across the shunt resistor 448. It may be noted that the common mode voltage on the shunt resistor 448 could become too low to handle (for some implementations of the current sense amplifiers described above) when the power switch 444 is turned on. In this case, it may be possible to position the shunt resistor 444 above the solenoid 442 so that the common mode voltage on the shunt resistor 444 remains close to the voltage +V1.

Figure 4D:
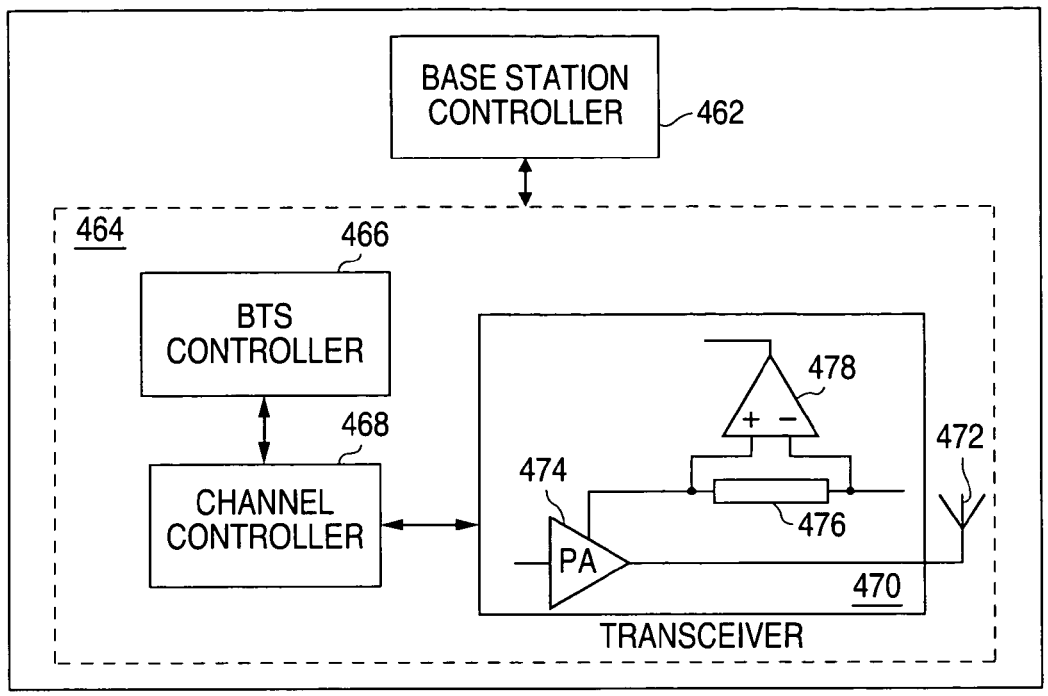

FIG. 4D illustrates an example base station 460, which includes a base station controller (BSC) 462 and one or more base transceiver subsystems (BTS) 464. The base station controller 462 generally controls the overall operation of the base station 460. The base station controller 462 could, for example, control wireless communication resources in the base station 460, such as the base transceiver subsystems 464. The base station controller 462 includes any hardware, software, firmware, or combination thereof for controlling a base station.

Each base transceiver subsystem 464 generally includes components used for wireless communications to and from the base station 460. In this example, each base transceiver subsystem 464 includes a base transceiver subsystem (BTS) controller 466, a channel controller 468, a transceiver 470, and an antenna 472. The BTS controller 466 generally controls the base transceiver subsystem 464 and communicates with the base station controller 462. The BTS controller 466 includes any hardware, software, firmware, or combination thereof for controlling a base transceiver subsystem.

During wireless communications, the channel controller 468 generally controls communication channels for communicating with wireless devices, such as forward (outbound) and reverse (inbound) channels. The channel controller 468 includes any hardware, software, firmware, or combination thereof for controlling communication channels in a base transceiver subsystem.

The transceiver 470 includes any suitable structure supporting wireless transmission of outbound signals and wireless reception of inbound signals, such as an RF transceiver. As a particular example, the transceiver 470 could include amplifiers, filters, and analog-to-digital converters for processing inbound signals and amplifiers, filters, and digital-to-analog converters for processing outbound signals. The antenna 472 represents any suitable structure for transmitting and receiving wireless signals, such as an RF antenna or antenna array.

In this example, the transceiver 470 includes a power amplifier (PA) 474, which generally operates to amplify a radio frequency (RF) or other signal to be transmitted by the antenna 472. As shown here, a shunt resistor 476 can be placed along a positive supply line that provides operating power to the power amplifier 474, and a current sense amplifier 478 can measure the voltage across the shunt resistor 476. The output of the current sense amplifier 478 could be provided back to one of the controllers 462, 466, 468 (possibly after being fed through an ADC). This may allow one of the controllers to, for example, control the emitter power of the base transceiver subsystem 464 or the base station 460.

Although FIGS. 4A through 4D illustrate examples of systems using a current sense amplifier with an extended common mode voltage range, various changes may be made to FIGS. 4A through 4D. For example, FIGS. 4A through 4D merely illustrate example ways in which the current sense amplifiers 100, 200, and 300 could be used. The current sense amplifiers could be used in any other or additional manner, such as in any application where a shunt resistor can be located and used to measure current.

Figure 5:
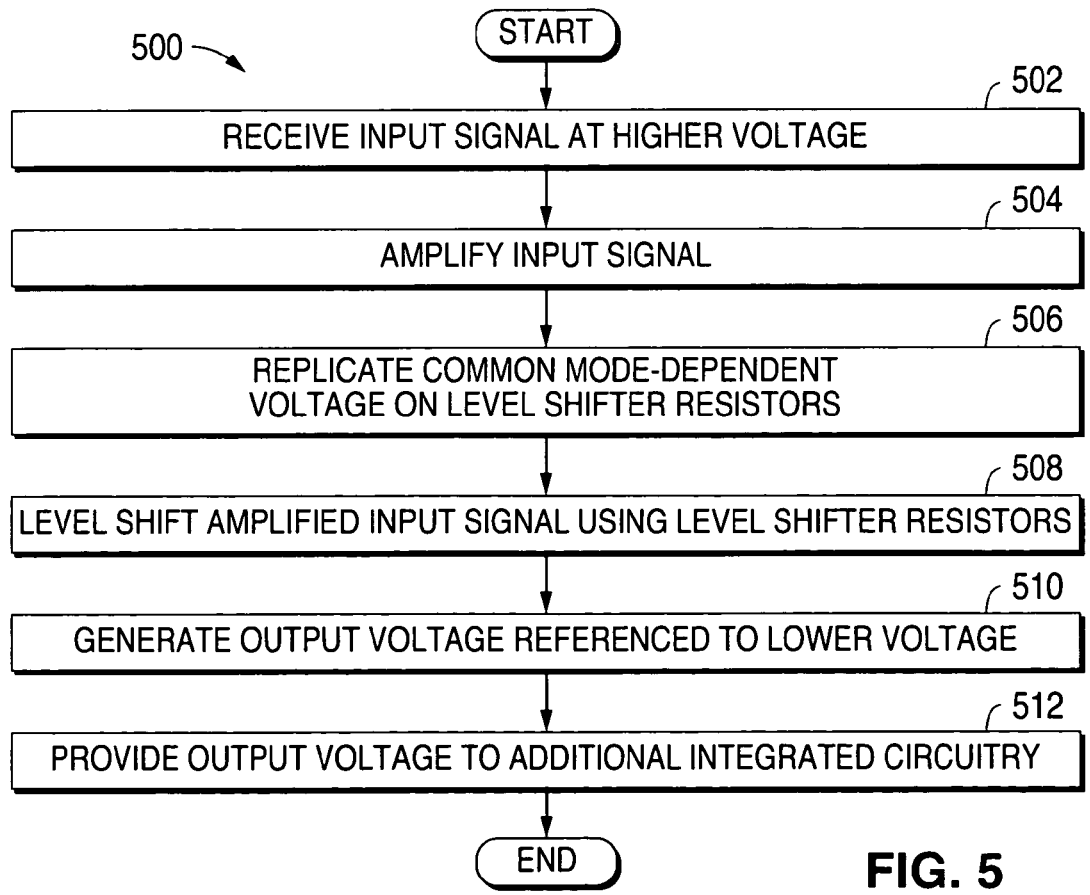
FIG. 5 illustrates an example method for measuring a current through a conductor according to this disclosure.

FIG. 5 illustrates an example method 500 for measuring a current through a conductor according to this disclosure. The embodiment of the method 500 shown in FIG. 5 is for illustration only. Other embodiments of the method 500 could be used without departing from the scope of this disclosure.

An input signal at a higher voltage is received at step 502. This could include, for example, the current sense amplifier 100, 200, or 300 receiving a differential input signal across a shunt resistor. The differential input signal could be referenced to a higher voltage, such as 12, 24, 45, or 60V (although larger or smaller voltages could also be used).

The input signal is amplified at step 504. This could include, for example, the current sense amplifier 100, 200, or 300 amplifying the differential input signal in an input stage of the current sense amplifier. The amplification here is occurring through the use of active components that are, in principle, low-voltage components, but their terminals are at a potential that is relatively close to the higher input common mode voltage. These active components are isolated from the substrate, such as through the use of SOI or junction isolation.

A common mode-dependent voltage is replicated across one or more level shifter resistors at step 506, and the amplified input signal is level shifted using the level shifter resistors at step 508. This could include, for example, the reference branch in the current sense amplifier 100, 200, or 300 generating a current that is mirrored across two level shifter resistors. This creates a level shift voltage across the level shifter resistors that tracks the common mode voltage of the input signal. Also, a bias current through the level shifter resistors can cause a sufficient potential drop across the level shifter resistors. This helps to lower the voltage of the input signal to a lower level that is suitable for use with additional integrated circuitry.

An output voltage is generated based on the level shifted input signal at step 510. This may include, for example, converting the level-shifted input signal into a proportional current using the second or transconductance stage of the current sense amplifier 100, 200, or 300, which includes a voltage-to-current converter. This may also include providing the proportional current to the output stage of the current sense amplifier 100, 200, or 300. Note that the conversion of the input signal into a current signal is not required, and the input stage described above (a high-voltage input stage with level shifter resistors) can be combined with any other suitable stage(s) (for performing current and/or voltage amplification) and feedback network(s) to form a current sense amplifier. The output stage generates an output voltage $V_{OUT}$, which is referenced to a lower voltage (such as ground potential or some other reference voltage $V_{REF}$). The lower reference voltage is lower than the voltage to which the input signal is referenced, and it is suitable for use by additional integrated circuitry. The output voltage is provided to the additional integrated circuitry at step 512, such as by providing the output voltage to an analog-to-digital converter.

Although FIG. 5 illustrates one example of a method 500 for measuring a current through a conductor, various changes may be made to FIG. 5. For example, while shown as a series of steps, various steps in FIG. 5 could overlap, occur in parallel, occur in a different order, or occur multiple times. Also, the input signal could be received from any suitable source and have any suitable form, and the output signal could be provided to any suitable destination in any suitable form.

It may be advantageous to set forth definitions of certain words and phrases that have been used within this patent document. The term "couple" and its derivatives refer to any direct or indirect communication between two or more components, whether or not those components are in physical contact with one another. The term "program" and its derivatives refer to any operation to store data, whether that operation is referred to as a write operation, a program operation, or other type of operation. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A circuit comprising:
   an input stage configured to receive and amplify an input signal to produce an amplified signal, the input signal referenced to a higher voltage and associated with a common mode voltage; and
   level shifter resistors configured to level shift the amplified signal to produce a shifted signal, the level shifter resistors configured to provide a voltage drop so that the shifted signal is referenced to a lower voltage;
   wherein the input stage comprises multiple transistors floating in one or more isolated portions of a substrate, the transistors configured to perform amplification in the input stage.

2. The circuit of claim 1, wherein:
   the one or more isolated portions of the substrate comprise one or more oxide-isolated portions of a silicon substrate; and
   the multiple transistors in the input stage comprise transistors configured to receive the input signal having the common mode voltage that is larger than a supply voltage of the circuit.

3. A circuit comprising:
   an input stage configured to receive and amplify an input signal to produce an amplified signal, the input signal referenced to a higher voltage and associated with a common mode voltage;
   level shifter resistors configured to level shift the amplified signal to produce a shifted signal, the level shifter resistors configured to provide a voltage drop so that the shifted signal is referenced to a lower voltage; and
   circuitry configured to control current through the level shifter resistors so that the voltage drop depends on the common mode voltage of the input signal.

4. The circuit of claim 3, wherein the circuitry configured to control the current through the level shifter resistors comprises a reference circuit, the reference circuit comprising an additional transistor coupled to the transistors in the input stage, a current through the additional transistor mirrored into the transistors in the input stage.

5. The circuit of claim 3, wherein:
   the input stage comprises multiple input branches; and
   the circuitry configured to control the current through the level shifter resistors comprises a reference branch included in one of the input branches, the reference branch configured to establish a reference current in the input branches that is dependent on the common mode voltage of the input signal.

6. A circuit comprising:
   an input stage configured to receive and amplify an input signal to produce an amplified signal, the input signal referenced to a higher voltage and associated with a common mode voltage, the input stage comprising multiple transistors;
   level shifter resistors configured to level shift the amplified signal to produce a shifted signal, the level shifter resistors configured to provide a voltage drop so that the shifted signal is referenced to a lower voltage; and
   a feedback network that includes:
      multiple input resistors, each input resistor coupled to one of the transistors in the input stage;
      a first feedback resistor coupled to one of the input resistors and to a reference voltage; and
      a second feedback resistor coupled to another of the input resistors and to an output voltage, the output voltage referenced to the reference voltage.

7. The circuit of claim 1, wherein the lower voltage is between supply rails of the circuit.

8. The circuit of claim 1, further comprising at least one additional stage configured to generate an output voltage based on the shifted signal provided by the level shifter resistors.

9. A system comprising:
   a shunt resistor configured to receive a current and to produce a differential input signal, the differential input signal referenced to a higher voltage and associated with a common mode voltage; and
   a current sense amplifier comprising:
      an input stage configured to receive and amplify an input signal to produce an amplified input signal, the input signal comprising or based on the differential input signal; and
      level shifter resistors configured to level shift the amplified input signal to produce a shifted signal, the shifted signal referenced to a lower voltage;
      wherein the input stage comprises multiple transistors floating in one or more isolated portions of a substrate, the transistors configured to perform amplification prior to the level shift.

10. The system of claim 9, wherein the level shifter resistors are configured to provide a voltage drop so that the shifted signal is referenced to the lower voltage.

11. The system of claim 10, wherein the lower voltage is between supply rails of the current sense amplifier.

12. The system of claim 9, wherein the current sense amplifier further comprises a reference circuit, the reference circuit comprising an additional transistor coupled to the transistors in the input stage, a current through the additional transistor mirrored into the transistors in the input stage.

13. The system of claim 9, wherein:
   the input stage comprises multiple input branches; and
   the current sense amplifier further comprises a reference branch included in one of the input branches, the reference branch configured to establish a reference current in the input branches that is dependent on the common mode voltage of the input signal.

14. The system of claim 9, wherein the current sense amplifier further comprises a feedback network that includes:
   multiple input resistors, each input resistor coupled to one of the transistors in the input stage;

a first feedback resistor coupled to one of the input resistors and to a reference voltage; and a second feedback resistor coupled to another of the input resistors and to an output voltage, the output voltage referenced to the reference voltage.

15. The system of claim 9, wherein the current sense amplifier further comprises at least one additional stage configured to generate an output voltage based on the shifted signal provided by the level shifter resistors.

16. The system of claim 15, further comprising:

an analog-to-digital converter coupled to the current sense amplifier and configured to convert the output voltage from the current sense amplifier into digital values.

17. The system of claim 9, further comprising:

a voltage source; and one or more components configured to operate using power from the voltage source, the shunt resistor coupled between the voltage source and the one or more components.

18. The system of claim 9, further comprising:

a power amplifier configured to amplify a signal for transmission by an antenna;

wherein the shunt resistor is coupled along a supply line of the power amplifier.

19. The system of claim 18, further comprising a controller configured to control an emitter power in a base station based on an output from the current sense amplifier.

20. A method comprising:

receiving and amplifying an input signal to produce an amplified signal, the input signal referenced to a higher voltage and associated with a common mode voltage, the input signal amplified using multiple transistors floating in one or more isolated portions of a substrate;

level shifting the amplified signal to produce a shifted signal, the shifted signal referenced to a lower voltage;

generating an output voltage based on the shifted signal; and feeding back the output voltage to a position before the input signal is amplified.

21. The method of claim 20, wherein feeding back the output voltage comprises:

providing a reference voltage to a first feedback resistor coupled to one of the transistors in the input stage; and providing the output voltage to a second feedback resistor coupled to another of the transistors in the input stage;

wherein the output voltage is referenced to the reference voltage.

22. The method of claim 20, further comprising controlling current through level shifter resistors that are level shifting the amplified signal so that a voltage drop across the level shifter resistors depends on the common mode voltage of the input signal.

23. A circuit comprising:

an input stage configured to receive and amplify an input signal to produce an amplified signal, the input signal referenced to a higher voltage and associated with common mode voltage; and level shifter resistors configured to level shift the amplified signal to produce a shifted signal, the level shifter resistors configured to provide a voltage drop so that the shifted signal is referenced to a lower voltage;

wherein the input stage comprises multiple transistors configured to receive the input signal having the common mode voltage that is larger than supply voltage of the circuit.

* * * * *